United States Patent [19]
Kamikawa et al.

[11] Patent Number: 5,804,835
[45] Date of Patent: Sep. 8, 1998

[54] METHOD OF OPERATING A HIGH TEMPERATURE SUPERCONDUCTIVE DEVICE COMPRISING SUPERCONDUCTIVE SOURCE, DRAIN, AND CHANNEL REGIONS

[75] Inventors: Taketomi Kamikawa; Eiji Natori; Setsuya Iwashita; Tatsuya Shimoda, all of Suwa, Japan

[73] Assignee: Seiko Epson Corporation, Tokyo, Japan

[21] Appl. No.: 463,322

[22] Filed: Jun. 5, 1995

Related U.S. Application Data

[62] Division of Ser. No. 87,776, filed as PCT/JP92/01484 Nov. 13, 1992, abandoned.

[30] Foreign Application Priority Data

| Nov. 13, 1991 | [JP] | Japan | 3-297417 |
| Jan. 22, 1992 | [JP] | Japan | 4-9544 |
| Mar. 6, 1992 | [JP] | Japan | 4-49899 |
| Mar. 10, 1992 | [JP] | Japan | 4-51596 |
| Apr. 16, 1992 | [JP] | Japan | 4-96598 |

[51] Int. Cl.$^6$ .......... H01L 29/12; H01L 39/22; H01L 39/16
[52] U.S. Cl. .......... 257/39; 257/33; 257/35; 257/36; 505/193
[58] Field of Search .......... 257/33, 35, 36, 257/39; 505/193

[56] References Cited

U.S. PATENT DOCUMENTS

| 5,106,823 | 4/1992 | Creuzet et al. . |
| 5,236,896 | 8/1993 | Nakamura et al. . |
| 5,407,903 | 4/1995 | Nakamura ........ 257/36 |
| 5,468,723 | 11/1995 | Nishino ........ 257/33 |

FOREIGN PATENT DOCUMENTS

| 0280308 | 8/1988 | European Pat. Off. . |
| 0324044 | 7/1989 | European Pat. Off. . |
| 63-261765 | 10/1988 | Japan . |
| 63-269585 | 11/1988 | Japan . |
| 2-37786 | 2/1990 | Japan . |
| 2-194667 | 8/1990 | Japan . |
| 3-09579 | 1/1991 | Japan . |
| 3-191581 | 8/1991 | Japan . |

*Primary Examiner*—Jerome Jackson
*Attorney, Agent, or Firm*—Eric B. Janofsky

[57] ABSTRACT

This is an invention of a superconductive device that is equipped with a first superconductive electrode, a second superconductive electrode and a junction that is made of a superconductive material that connects these superconductive electrodes, wherein there are 2-terminal or 3-terminal superconductive devices that use a junction that is in a superconductive state that is weaker than the first and the second superconductive electrodes or in a normal conductive state that is near the superconductive state. The differences between the critical current, the critical temperature, the pair potential and the carrier densities of the first and the second superconductive electrodes and the junction are used as a means of putting the junction in the states mentioned above. Based on the methods mentioned above, a superconductive device which has few pattern rule restrictions and which is easy to fabricate can be offered. And in the case of the 3-terminal superconductive device, the switching characteristics can be improved.

32 Claims, 5 Drawing Sheets

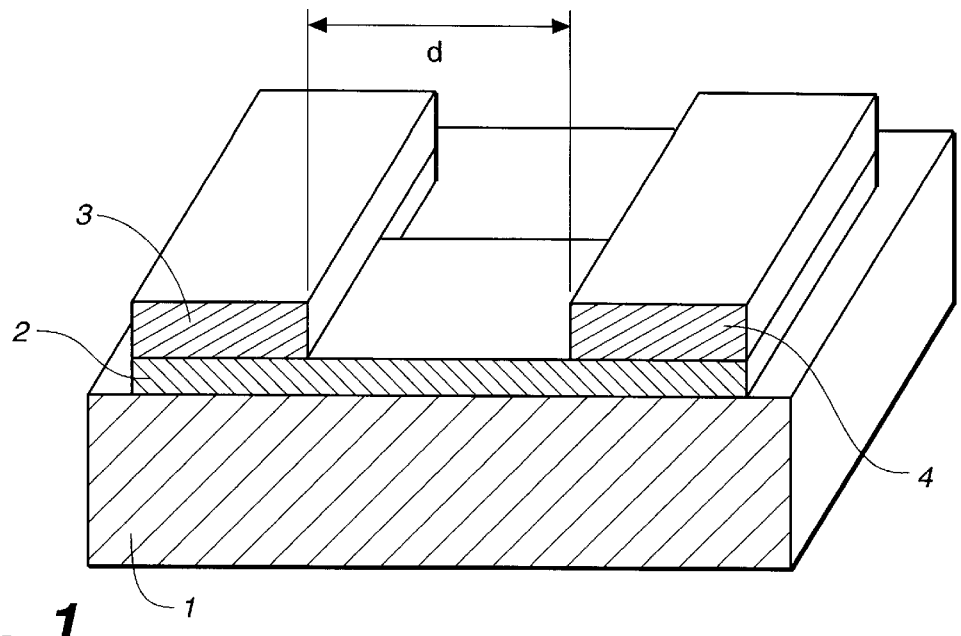
FIG._1
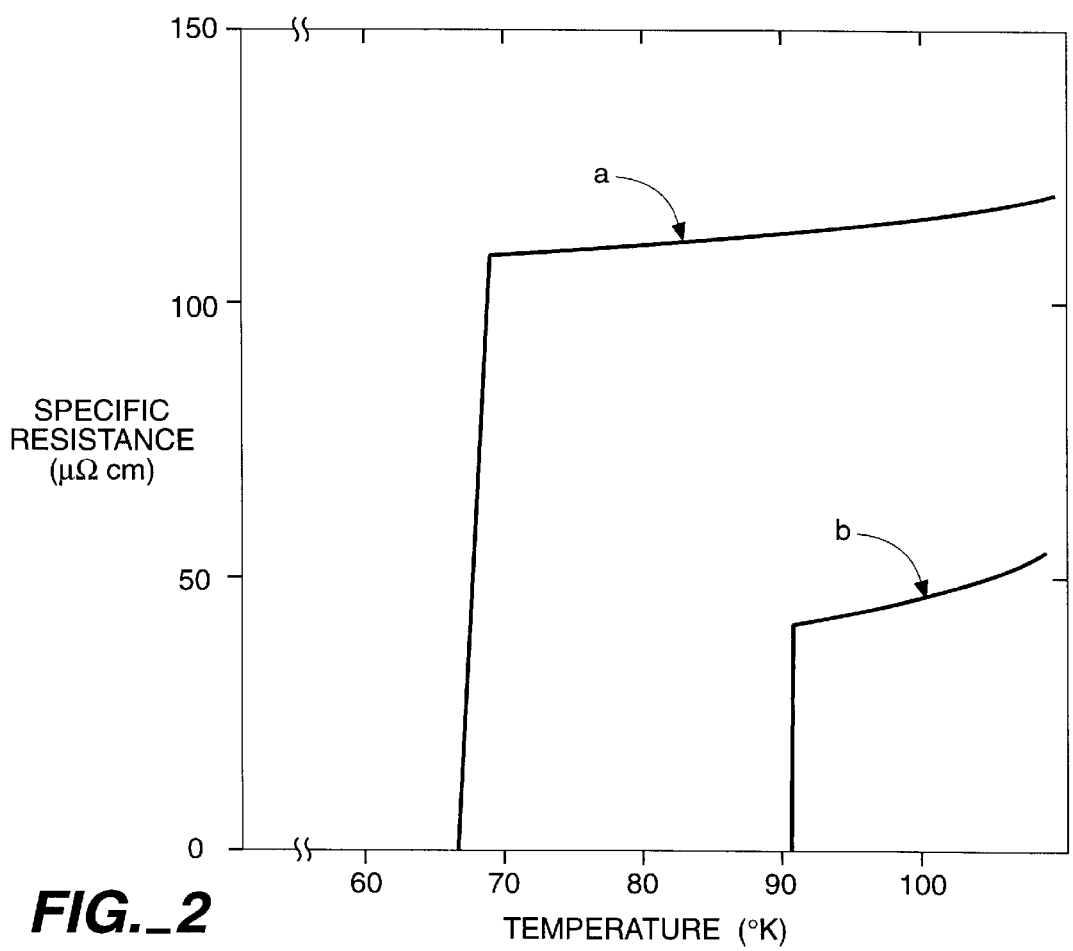
FIG._2

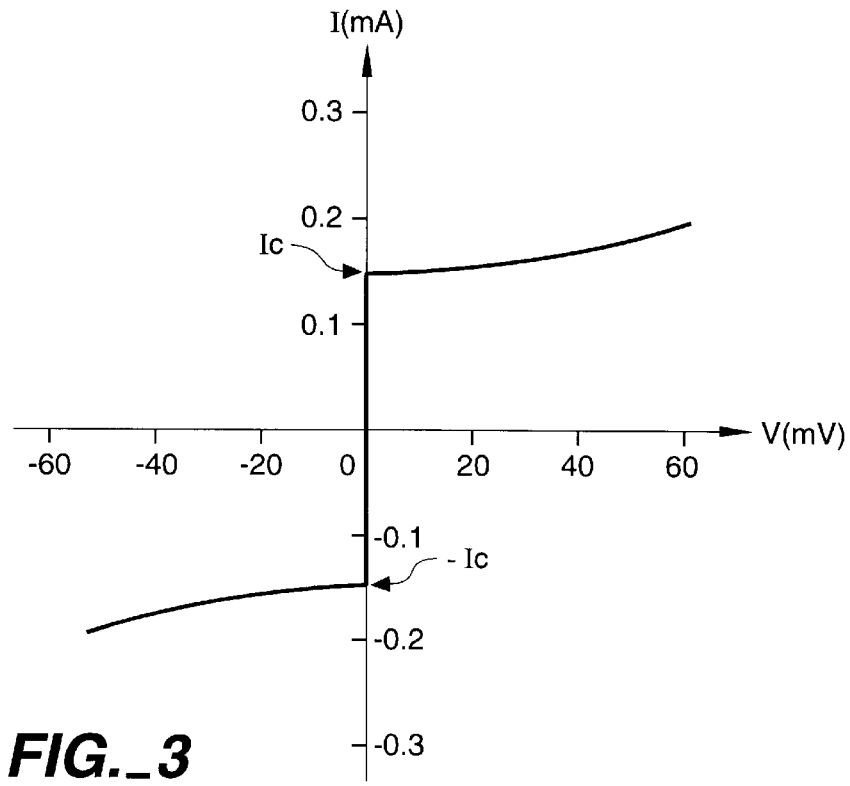
FIG._3
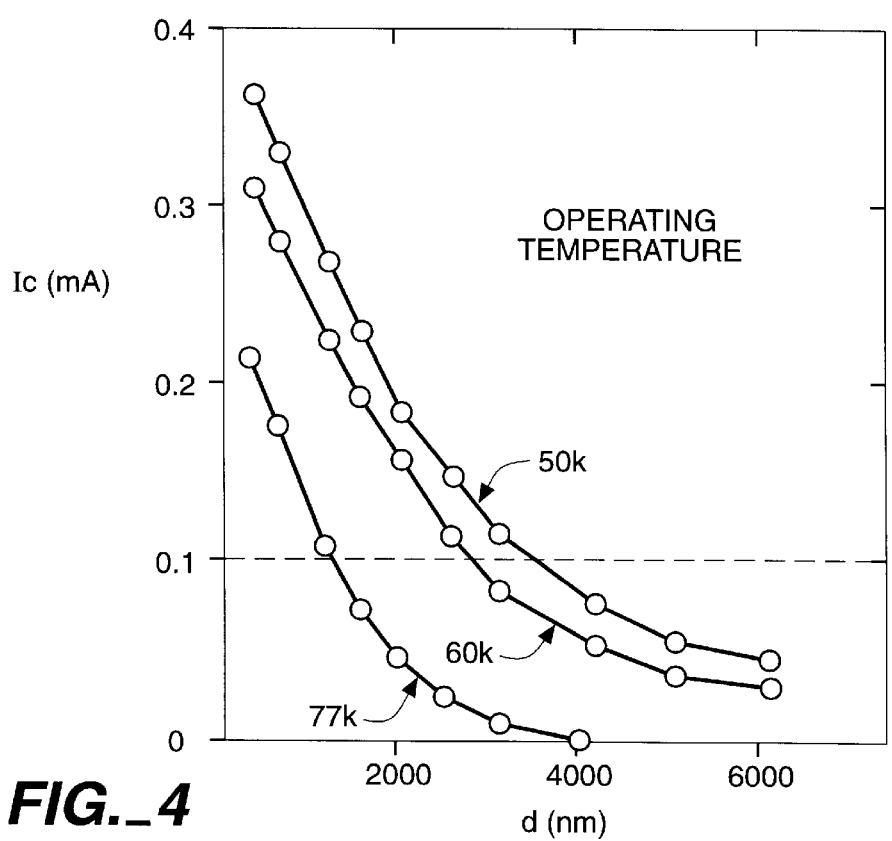
FIG._4

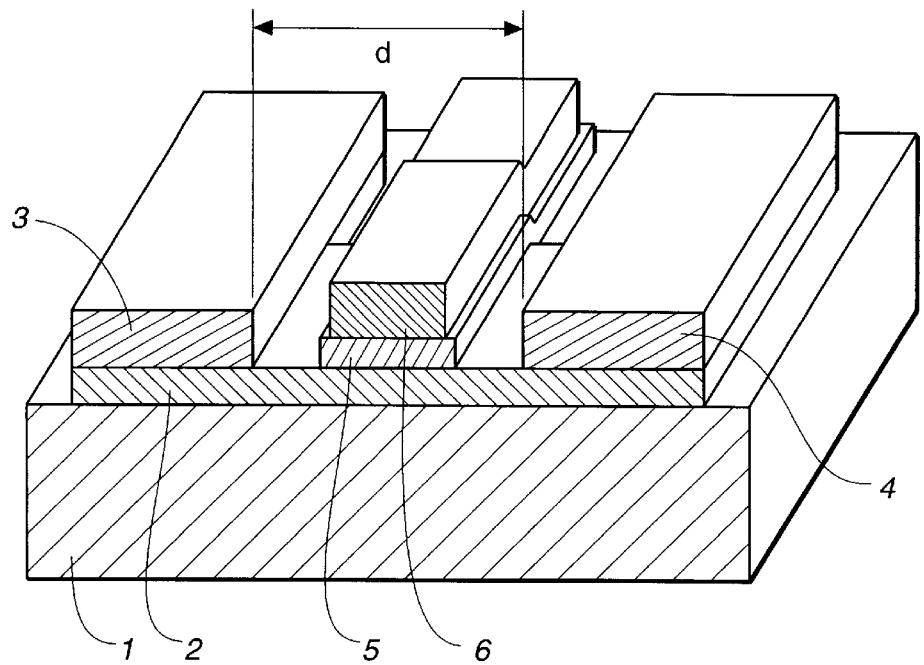
FIG._5
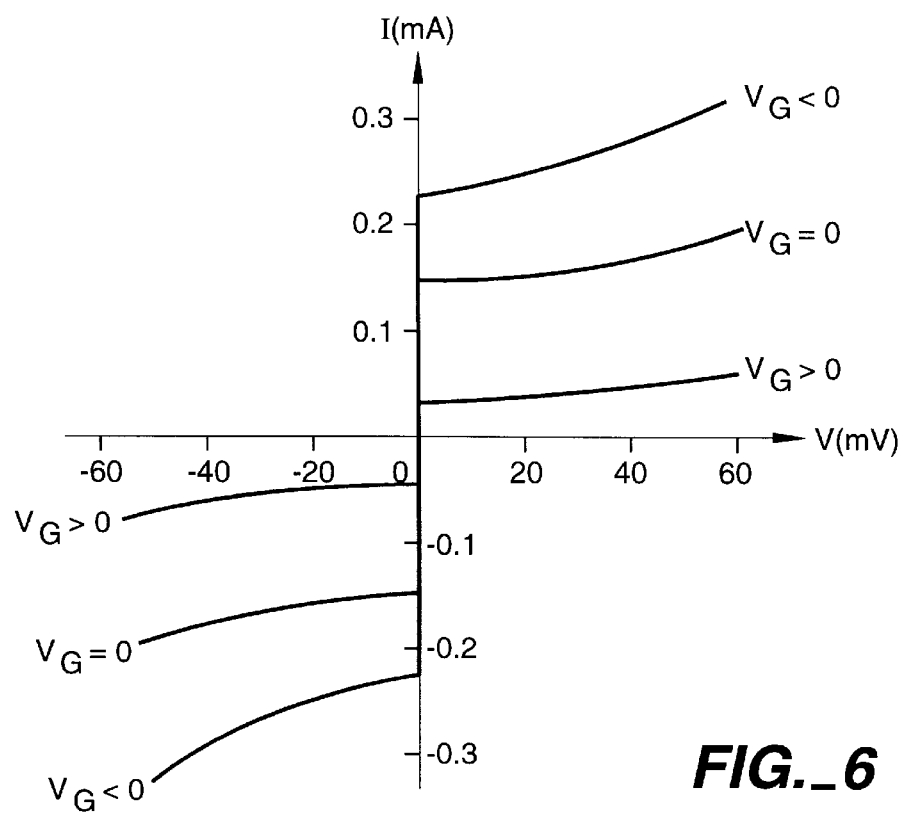
FIG._6

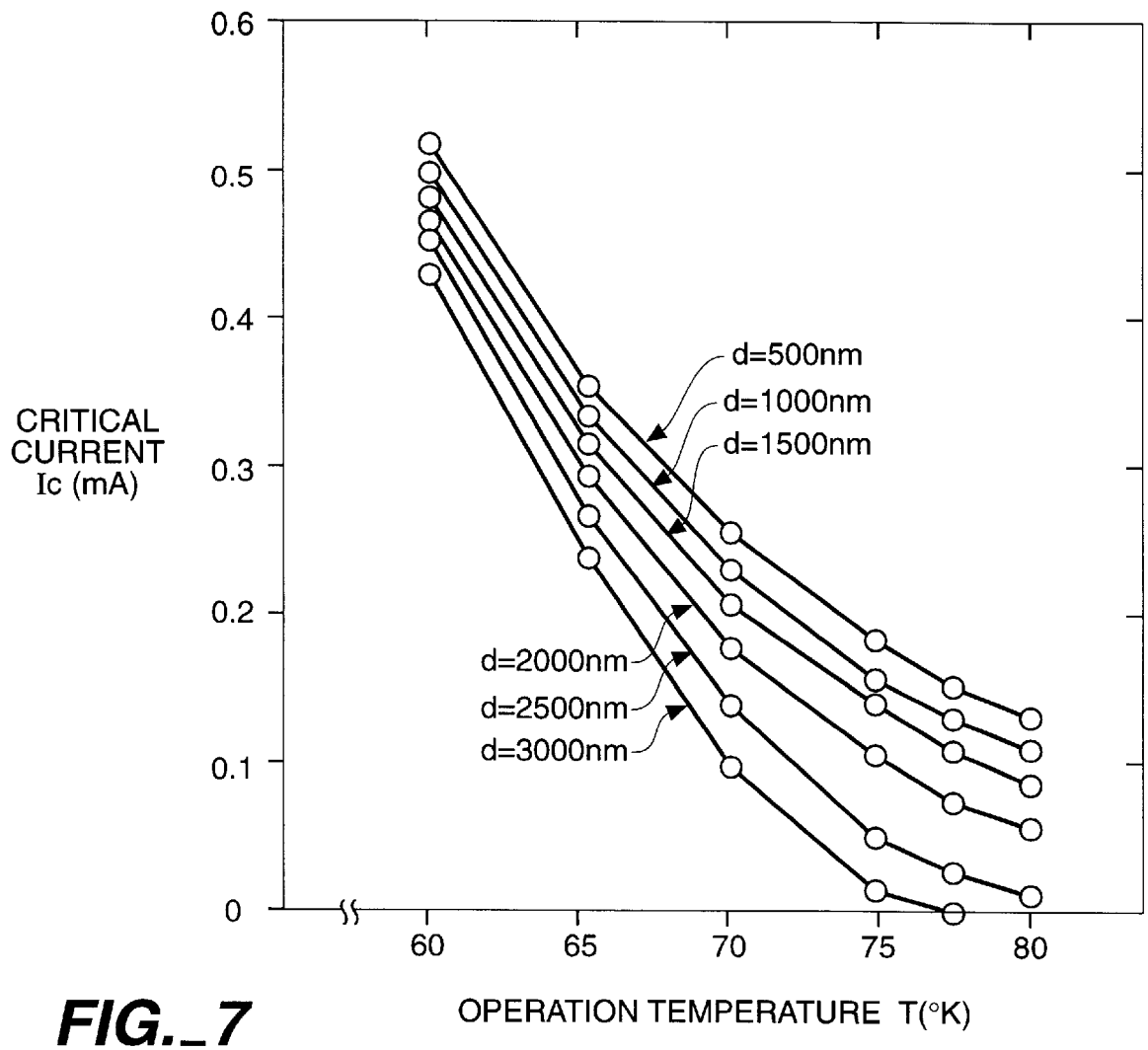
FIG._7

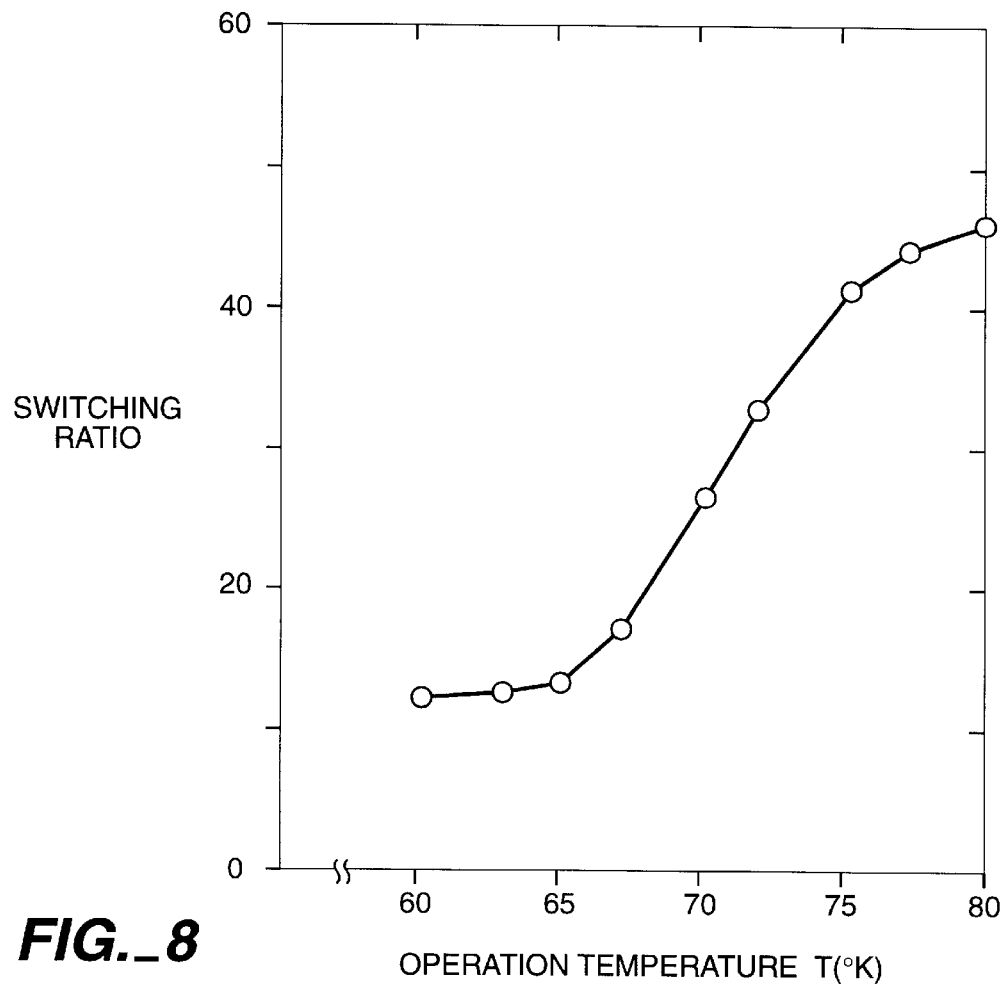
FIG._8
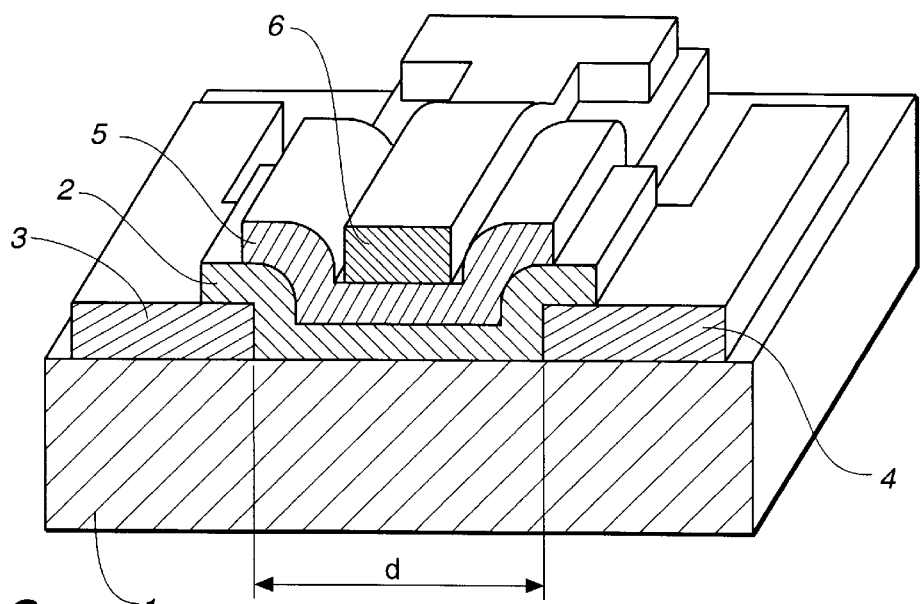
FIG._9

METHOD OF OPERATING A HIGH TEMPERATURE SUPERCONDUCTIVE DEVICE COMPRISING SUPERCONDUCTIVE SOURCE, DRAIN, AND CHANNEL REGIONS

This is a Divisional of prior application Ser. No. 08/087,776, filed as PCT/JP92/01484 Nov. 13, 1992, abandoned.

BACKGROUND OF THE INVENTION

1. Field of the Invention

This invention relates generally to a superconductive device for use in constructing components such as electronic switches, memory devices, SQUIDs, electromagnetic wave detectors, and voltage references.

2. Related Technical Art

Superconductive devices make a variety of applications possible in the field of electronics because it has peculiar properties, both electrical and magnetic, and because it can operate at high speeds with low power consumption. For this reason, a great deal of superconductive device research and development has taken place to date. In particular, problems encountered with large-scale cooling equipment and operating costs have been resolved by the discovery of the oxide type superconductor, which possesses a high critical temperature. This has led to the present situation, in which research and development is being spurred even more.

In general, the basic components of a superconductive device are formed from two superconductive electrodes and a junction linking these two electrodes. This structure is applicable to both 2-terminal and 3-terminal superconductive devices.

In general, an insulator, a semiconductor, or a normal conductor is used to form the junction. However, even if a superconductive material is used, in many cases, the operating temperature of the device is set at a temperature that is much higher than the critical temperature of the superconductive material, and such material is often used as a perfectly normal conductor.

Prior-art superconductive devices use a weak superconductive link to couple the two superconductive electrodes in a weak manner through the junction. The reason the weak superconductive link occurs when using a junction manufactured from an insulator or some semiconductor materials, is a result of the so-called tunnel effect. Alternatively, when the junction is manufactured from some semiconductor materials, normal conductors, or other superconductive materials, a weak bond results from the so-called superconductive state penetration effect. In other words, the proximity effect.

In addition to the prior-art examples described above, for 3-terminal superconductive devices in particular, two more specific examples are presented below. Japanese patent number 1-207982 illustrates one example of a 3-terminal superconductive device that uses superconductive material as the junction that is in a superconductive state to modulate current that flows between superconductive electrodes through application of a signal voltage to a control electrode attached to the junction.

In this example, the junction functions in the same manner as both first and second superconductive electrodes. In other words, the first and second superconductive electrodes and the junction are each formed from the same superconductive material. The function of such superconductive devices is not based on either the tunnel effect nor the proximity effect. It is based on the destruction of a zero electrical resistance state at a current for which the junction is above the critical current flow, and where, as a result of the signal voltage, a depletion layer is formed on the junction so that the junction functions as a channel.

Japanese patent numbers 63-234572, 63-234573, and 63-234574, provide another prior art example of a 3-terminal superconductive device which is made to operate at an intermediate temperature between $T_c$ onset and $T_{c0}$, in which the junction is made from a superconductive material which has a large temperature difference between $T_c$ onset (the temperature at which superconductivity begins) and $T_{c0}$ (the temperature at which the electrical resistance becomes zero).

However, superconductive devices of the prior art, which are based on the tunnel or proximity effects, have a drawback in that the junction has to be formed as an extremely thin film of only a few hundred nanometers or less in thickness. Another drawback is that these devices cannot adequately demonstrate their functions unless formed using an extremely fine line pattern. Whether using the tunnel effect or the proximity effect, the reason for this limitation is that the length at which these effects occur ranges from tens to hundreds of nanometers for the materials used for superconductive devices in the prior art, and in the case of the operating environment.

For the proximity effect in particular, generally the penetration depth has a close relationship to the coherence length of the junction, and both are to be the same. However, the coherence length of an oxide high temperature superconductor is shorter than that of a metallic superconductor. As a result, for a superconductive device using the proximity effect of an oxide high temperature superconductor, it is necessary to limit the size of the junction to a few nanometers (nm) or less. To make a channel having such dimensions is extremely difficult for both thin-film technology and photolithography technology.

Furthermore, for a 3-terminal superconductive device in which a control electrode is attached to the junction, restrictions on the channel size translates to restrictions for the control electrode attachment region, which creates even greater difficulties. As is clear from the above description, restricting the size of the junction to a few hundred nanometers or restricting it to a few nanometers is a major negative factor on production yield, reliability, and reproducibility and uniformity for the superconductive device. In particular, for an oxide high temperature superconductor, restrictions on the size of the junction become more stringent for the reasons already given. Moreover, because one valuable advantage cannot be obtained, that is, possessing a high critical temperature, this must be considered a major drawback.

Furthermore, in terms of a 3-terminal superconductive device of the prior art as described in Japanese patent number Hei 1-207982, having a device that uses the junction in a superconductive state, the problem is one of obtaining good size characteristics. The reason for this is that it is difficult to use the junction as a channel and form a depletion layer that is thick enough to create a clear on/off state. In order to obtain a depletion layer of sufficient thickness, it is necessary to use a signal voltage that is too high to be practical as the operating voltage of the superconductive device, or it is necessary to have the film thickness of the junction be so thin that its superconductive characteristics break down.

Moreover, in prior-art examples for 3-terminal superconductive devices as disclosed in Japanese patent numbers 63-234572, 63-234573, and 63-234574, because the channel is used in a resistive superconductive state, it is necessary to apply a non-zero voltage to the channel, which has the drawback of not allowing the use of superconductive current, which is otherwise a benefit of a superconductive device. From the point of view of material technology, a superconductive material in which the temperature difference between $T_c$ onset and $T_{c0}$ is large is a low-quality material that lacks reliability and stability, and is impractical.

This invention solves these problems and has few restrictions concerning the film thickness and pattern rule. It is also easy to produce, and has both high yield and reliability. Moreover, it is possible to form a junction from an excellent superconductive material and offer a superconductive device that is able to utilize superconductive current flowing at zero voltage. In addition to the characteristics described above, for a 3-terminal superconductive device, this invention offers a superconductive device that especially has excellent switching characteristics.

SUMMARY OF THE INVENTION

This invention comprises a first superconductive electrode, a second superconductive electrode and a junction that electrically links these superconductive electrodes together. When the junction is formed from a superconductive material, a superconductive state that is weaker than those of either the first and second superconductor electrodes, or a normal conductive state that is near the superconductive state, is used on the junction. As a result, there are few restrictions concerning film thickness, and production is simple, which improves production yield and reliability. Thus, the superconductive device that is obtained has a junction manufactured from an excellent superconductive material, and utilizes a superconductive current that flows at zero voltage.

In addition, by forming a control electrode adjacent to the junction ,and using the junction as a channel, it is possible to obtain a 3-terminal superconductive device having excellent switching characteristics.

Creating a superconductive state that is weaker than those of the first and the second superconductive electrodes or causing a normal conductive state that is near the superconductive state, the methods utilized lower the critical temperature of the junction below the critical temperature of the first and second superconductive electrodes, reduce the carrier density of the junction below the carrier density of the first and second superconductive electrodes, and make the size of the pair potential of the junction smaller than that of the first and second superconductive electrodes.

Switching characteristics and reliability are increased further by forming the junction, and first and second superconductive electrodes from an oxide superconductive material, having the carrier density of the junction reside in a range from $10^{19}$ to $10^{20}/cm^3$, selecting a combination of materials having a junction crystal structure that differs from that of the first and the second superconductive electrodes, and setting the operating temperature within plus or minus 5° K. of the junction critical temperature.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 illustrates a perspective view of a cross section of a 2-terminal superconductive device constructed according to the principles of the present.

FIG. 2 shows temperature characteristics for specific resistance values for the superconductor materials used in implementing the invention.

FIG. 3 shows an example of I/V characteristics for the 2-terminal superconductive device of FIG. 1.

FIG. 4 shows a relationship between an distance "d" between the first and second superconductive electrodes for the device of FIG. 1 and and critical current $I_c$.

FIG. 5 shows a perspective view of a cross section of a 3-terminal superconductive device constructed according to the principles of the present.

FIG. 6 shows one example of the dependency of the I/V characteristics of the 3-terminal superconductive device of FIG. 5 on control electrode voltage.

FIG. 7 shows a relationship between operating temperature T and critical current $I_c$ flowing between the first and the second superconductive electrodes of FIG. 5.

FIG. 8 shows a relationship between operating temperature T and a device switching ratio.

FIG. 9 shows a perspective view of a cross section of a 3-terminal superconductive device implemented using a method in which a difference in carrier density is created.

DESCRIPTION OF THE PREFERRED EMBODIMENTS

A perspective view of a cross section of a 2-terminal superconductive device is shown in FIG. 1. This superconductive device is formed on a substrate 1, and has a junction 2, a first superconductive electrode 3, and a second superconductive electrode 4. Symbol "d" in FIG. 1 represents a separation distance between the first and second semiconductor electrodes. If stated in terms of materials used, substrate 1 is manufactured from $SrTiO_3$, junction 2 from $YBa_2Cu_3O_{7-x}$ ($0.2 \leq x \leq 0.5$), and first and second superconductive electrodes 3 and 4 from $YBa_2Cu_3O_{7-y}$ ($0 \leq y < 0.2$).

A method of producing this superconductive device is generally implemented as follows. Molecular beam epitaxy (MBE) is used to form junction 2 from $YBa_2Cu_3O_{7-x}$ ($0.2 \leq x \leq 0.5$) material at a thickness of 100 nm on substrate 1. Following this, first and second superconductive electrodes 3 and 4 are formed from $YBa_2Cu_3O_{7-y}$, $0 \leq y < 0.2$) at a thickness of 100 nm. Oxidation of the thin film takes place during MBE using an electron cyclotron resonance (ECR) plasma generating apparatus to introduce activated oxygen at the same time that the film is being deposited. After that, patterning takes place to obtain a 2-terminal superconductive device with the structure shown in FIG. 1.

In the production method described above, controlling the amount of oxidation, as represented by the indicators x and y, is made possible by adjusting the oxygen gas pressure and flow rate, as well as by adjusting the concentration or amount of activated oxygen used by the ECR plasma generating apparatus, or by adjusting the deposition rate. Where x and y reside in the ranges specified by ($0.2 \leq x \leq 0.5$) and ($0 \leq y < 0.2$), the $YBa_2Cu_3O_{7-x}$ material is a 70° K. class superconductor and the $YBa_2Cu_3O_{7-y}$ material is a 90° K. class superconductor. The reason that the critical temperature can be controlled by the controlling the degree of oxidation in this manner is that physical properties of the oxide superconductor are essentially related to the volume of oxygen doping. When the degree of oxidation indicators x or y are near 0.2, the critical temperature becomes an intermediate temperature between 70° K. and 90° K.

Moreover, when the value of x is near 0.5, the critical temperature is smaller than 70° K. If the degree of oxidation is smaller than 0.5, the critical temperature decreases and ultimately the material no longer exhibits superconductivity. As a result, in order to make the critical temperature of the junction 70° K., or to make the critical temperature of the first and second superconductive electrodes 90° K., it is desirable to have the indicators x and y fall within the ranges $0.25 \leq x \leq 0.4$ and $0 \leq y \leq 0.15$, respectively. In this embodiment, the same YBCO type substance is used for the junction and the first and second superconductive electrodes. Therefore, continuous deposition is possible, which is favorable for thin film deposition technology. In addition, the lattice constants of $YBa_2Cu_3O_{7-x}$ ($0.2 \leq x \leq 0.5$) and $YBa_2Cu_3O_{7-y}$ $0 \leq y < 0.2$) are about the same. This is good for thin film epitaxial growth technology.

The temperature characteristics of the specific resistance of the superconductor used in this embodiment are shown in FIG. 2. The curve indicated by "a" in FIG. 2 is the temperature characteristics of the specific resistance of the junction. The curve indicated by "b" in FIG. 2 is the temperature characteristics of the specific resistance of the first and second superconductive electrodes. As shown in FIG. 2, the temperature difference between the junction and the first and second superconductive electrodes is several °K. below $T_c$ onset and $T_{c0'}$. This temperature difference is a small value for an oxide superconductor and indicates that both films are superconductive thin films of excellent quality.

Samples were fabricated with various distances "d" between the first and second superconductive electrodes as listed in Table I, and then tested.

TABLE I

| d (nm) | | | | |
| --- | --- | --- | --- | --- |
| 200 | 500 | 1000 | 1500 | 2000 |
| 2500 | 3000 | 4000 | 5000 | 6000 |

For each test sample, I/V characteristics between the first and second superconductive electrodes were measured at operating temperatures of 50° K., 60° K., and 77° K. One example of I/V characteristics for a 2-terminal superconductive device is shown in FIG. 3. Symbol $I_c$ in FIG. 3 indicates critical current. Zero voltage superconductive current flows in a current region from $-I_c$ to $+I_c$, and outside this region, voltage is generated. In other words, the I/V characteristics shown in FIG. 3 show the characteristics of a resistivity shunted junction (RSJ).

The relationship between distance "d" between the first and second superconductive electrodes and the critical current $I_c$, is shown in FIG. 4. As seen in FIG. 4, when the operating temperature is lower than the 70° K. critical temperature of the junction, all samples have the characteristic of zero voltage superconductive current. In addition, when the operating temperature is 77° K., which is higher than the 70° K. critical temperature of the junction, samples with a value for "d" smaller than 3000 nm have the characteristic of superconductive current at zero voltage.

If the superconductive device is actually operated, and if a critical current of 1 mA or more is required, the minimum value for distance "d" is, for example, about 3000 nm at 50° K., and 1000 nm at 77° K. The values for "d" are dimensions that can be easily patterned with existing photolithography techniques, or that can be patterned without accompanying technical difficulties.

Reasons for obtaining RSJ characteristics for all samples at an operating temperature lower than the junction critical temperature, and for samples that have a comparatively large "d" value and in which patterning is possible using photolithography, are as discussed below.

The reason for an operating temperature lower than the critical temperature of the junction is as follows. A superconductor made from $YBa_2Cu_3O_{7-x}$ ($0.2 \leq x \leq 0.5$) material enters the superconductive state as a result of this operating temperature. However, critical current density is smaller than that of the first and second superconductive electrodes, which are each made from $YBa_2Cu_3O_{7-y}$, $0 \leq y < 0.2$) material. For this reason, when current goes through a superconductive device that has the structure of this embodiment, phenomena described below occurs.

When the magnitude of the current is smaller than that for the critical current of the junction, superconductive current flows. There is no relationship to distance "d" in this situation. In principle, the current flows no matter how large "d" is.

When the magnitude of the current exceeds that of the critical current of the junction, the results are further divided into two cases according to the size of the current. In the first case, a current that is slightly larger than the critical current of the junction is allowed to flow. In the second, a current that is larger than the current in the first case is allowed to flow.

In the first case, in spite of the fact that when the junction is a single unit, the superconductive state is broken, the superconductive state of the junction is maintained due to the proximity effect caused by the first and second superconductive electrodes being adjacent to each other. As a consequence, in this case, superconductive current flows in the same manner as when a current smaller than the critical current of the junction is allowed to flow. However, in the experimental criteria for this embodiment, because "d" is large enough to allow the proximity effect to operate effectively, the region of superconductive current that corresponds to the first case is limited to a small range.

In the second case, the superconductive state of the junction is completely broken or disrupted and the voltage is generated between the first and second superconductive electrodes. To summarize the preceding, superconductive current will flow up to the critical current $I_c$, and at currents higher than that, voltage will be generated. This can be described as attaining RSJ characteristics. However, as is clear from the preceding discussion, strictly speaking, $I_c$ is a value that is larger than the critical current of the junction as a single unit.

The reason for using an operating temperature for the junction higher than the critical temperature is discussed next. A junction made from $YBa_2Cu_3O_{7-x}$ ($0.2 \leq x \leq 0.5$) enters the superconductive state at an operating temperature as a single unit. However, because the junction makes contact with the first and second superconductive electrodes, the superconductive state penetrates inside of the junction due to the proximity effect. As a result, for the junction, the region reached by the proximity effect becomes superconductive even at an operating temperature that is higher than the critical temperature.

However, the penetration attenuates or is damped as the contact surfaces with the first and second superconductive electrodes separate inside of the junction. According to the Ginzburg-Landau theory, the state or magnitude of this damping depends on temperature. That is, the closer the material temperature is to the critical temperature, the smaller the damping and the greater the penetration depth. When the critical temperature is reached, the penetration depth becomes infinite.

As a result, although the operating temperature is higher than the critical temperature, if the former temperature is close enough to the latter temperature, the proximity effect is effective for a sufficiently large distance. The foregoing is the reason that an adequate proximity effect can be obtained even if distance "d" is comparatively large. For this reason, if the operating temperature of the superconductive device is higher than the critical temperature of the junction, and the closer those temperatures are to each other, in other words, if the ratio of the operating temperature to the critical temperature is greater than 1 and the closer the ratio is to 1, the greater the distance "d" is allowed to be, which is advantageous in terms of patterning.

After the structure of the 2-terminal superconductive device described above has been fabricated, a dielectric, and a control electrode are each formed and patterned to produce a 3-terminal superconductive device. A perspective view of a cross section of a 3-terminal superconductive device constructed according to the invention is shown in FIG. 5. This superconductive device comprises a substrate 1, a junction 2, first superconductive electrode 3, second superconductive electrode 4, a dielectric 5, and a control electrode 6. The values for distance "d" are exactly the same as those shown in Table I.

For this superconductive device, I/V characteristics of the current that flows between the first and second superconductive electrodes is controlled by voltage applied to the control electrode to modulate the current. The modulation characteristics of each sample were measured at 50° K., 60° K., and 77° K. One example of the dependency of the I/V characteristics for the 3-terminal superconductive device on control electrode voltage is shown in FIG. 6. Symbol $V_G$ in FIG. 6 represents the control electrode voltage. As shown in FIG. 6, the I/V characteristics can be controlled by the voltage applied to the control electrode.

When the applied control voltage is positive, the magnitude of the critical current decreases as the control voltage increases. When the applied control voltage is negative, the magnitude of the critical current increases as the absolute value of the critical current increases. These modulation characteristics were obtained for all samples at an operating temperature that was lower than the 70° K. critical temperature of the junction, as well as for samples in which distance "d" was smaller than 3000 nm, even at a 77° K. operating temperature, which is higher than the 70° K. critical temperature of the junction.

Moreover, for other samples in which superconductive current does not flow, the result is that I/V characteristics in the voltage generating region can be controlled by the voltage applied to the control electrode. The reason that such control is possible is that dielectric 5 is polarized by the applied voltage. As a result, the carrier density of junction 2 is modulated. That is, the junction functions as a channel, in the case of a 3-terminal superconductive device.

In the above examples, a class of junction having a critical temperature of 70° K. was used. However, the critical temperature of the junction can be controlled by adjusting the concentration "x" of oxygen in the material. For this reason, when a sample having a junction using several different critical temperatures, ranging from 60° K. to 70° K., was fabricated, and the control electrode dependency of the I/V characteristics was evaluated, the I/V characteristics for all of the samples could be controlled using the voltage applied to the control electrode.

Applying this invention to such a 3-terminal superconductive device has an advantage that fabrication is simple because a broad area can be used for attaching a control electrode.

An analysis for optimizing the operating temperature of the superconductive device of this invention was undertaken. The basic structure, material, and method of fabricating the sample used in the experiment was the same as for the 3-terminal superconductive device shown in FIG. 5. However, in order to gain more marked modulation characteristics, the film of the junction was made thinner than that of the first and second superconductive electrodes. The film thickness of the junction was from 5 nm to 50 nm. In addition, the film thickness of the first and second superconductive electrodes was from 50 nm to 150 nm.

The critical temperature of the junction is 70° K. As for distance d, six types of samples were fabricated, with a "d" of 500 nm, 1000 nm, 1500 nm, 2000 nm, 2500 nm, and 3000 nm, respectively. Using the samples mentioned above, the I/V characteristics of the current flowing between the first and second superconductive electrodes was measured at more detailed operating temperatures, ranging from 60° K. to 80° K. For these measurements, the control electrode was put in a floating state that does not apply voltage.

The relationship between the operating temperature and the critical current $I_c$ flowing between the first and second superconductive electrodes is shown in FIG. 7. As shown in FIG. 7, if the operating temperature is about 75° K. or lower, that is, if the temperature is about 5° K. higher than the 70° K. critical temperature of the junction, $I_c$ is 0.1 mA or higher even if "d" is 2000 nm. If d=2000 nm, it is at a value for which patterning takes place easily even with present-day photolithography technology. A sample for which d=2000 nm was used to analyze control of the I/V characteristics at more detailed operating temperature values, that ranged from 60° K. to 80° K., using voltage applied to a control electrode.

The relationship between the operating temperature and the switching ratio is shown in FIG. 8. The switching ratio was defined by the maximum and minimum critical currents that are able to implement control using the control electrode voltage. As shown in FIG. 8, within the measurement range, the higher the operating temperature the larger the switching ratio. With the operating temperature in the vicinity of 65° K. in particular, that is, at a temperature that is 5° K. lower than the critical temperature of the junction, the switching ratio enlarges sharply. At a temperature 2° K. to 3° K. lower than the critical temperature of the junction, the switching ratio becomes 20 or more, which is a sufficiently practical value. The relationship between operating temperature and the switching ratio was evaluated for samples other than those in which d=2000 nm. The results were almost identical to those shown in FIG. 8.

To summarize the experiments described above, if the operating temperature is set to within plus or minus 5° K. of the critical temperature of the junction, or ideally, if set to within plus or minus 3° K., a superconductive device for which fabrication is both simple and having excellent electrical properties is obtained. If the operating temperature is lower than the critical temperature of the junction, the critical current will be large. Therefore, the superconductive device is suitable to fields of use requiring large currents. In the reverse case, it is suitable to applications requiring a large switching ratio.

The same types of operating temperature optimizing analysis took place for various samples using junctions having different critical temperatures, ranging from 60° K. to 70° K. Junctions were fabricated using a film thickness of from 5 nm to 50 nm, and first and second superconductive electrodes were fabricated with a film thickness of from 50 nm to 150 nm. As a result, if the operating temperature was set within a range of the critical temperature of the junction ±5° K., excellent electrical properties were obtained. Moreover, where the operating temperature was set within ±5° K. of the critical temperature of the junction, the lower the critical temperature of the junction, the larger the switching ratio. As a result, the larger the difference between the critical temperature of the first and second superconductive electrodes and that of the junction, the more the switching characteristics improved.

In a temperature region at or below the critical temperature of the junction, the reasons for the switching ratio being larger the closer the operating temperature approaches the critical temperature of the junction, are as follows. The first reason is that as the temperature increases, the carrier density of the junction decreases. The control of switching takes place due to dielectric polarization caused by the applied voltage, which results in a modulation of the number of carriers of the junction. Therefore, even though the same number of carriers are modulated, the lower the number of carriers overall, the larger the modulation ratio. In other words, the larger the switching ratio. Therefore, the carrier concentration of an oxide superconductor is smaller than that of a metal superconductor. Thus, for the junction, if an oxide superconductor is used, a large modulation becomes conveniently possible.

Second, the superconductive state of the junction is strengthened by penetration of the superconductive state from the first and second superconductive electrodes. However, the level by which the superconductive state is strengthened increases as the temperature decreases. If the superconductive state of the junction is strengthened, modulation becomes difficult, resulting in a decrease in the switching ratio. The strength or weakness of the superconductive state corresponds to high or low superconductive carrier density. Thus, in that sense, these two reasons are mutually related.

In the 2-terminal and 3-terminal superconductive devices described above, the critical temperature of the first and second superconductive electrodes are higher than that of the junction. As a result, when the operating temperature is lower than the critical temperature of the junction, the junction is in a superconductive state that is weaker than that of the first and second superconductive electrodes. When the operating temperature is higher than the critical temperature of the junction, the junction is in an normal conductive state that is close to the superconductive state.

A description is provided next concerning inconveniences that occur if the critical temperature of the first and second superconductive electrodes is the same as that of the junction. If the critical temperature of the first and second superconductive electrodes and that of the junction are the same, and if the operating temperature is higher than that critical temperature, the first and second superconductive electrodes cease being in the superconductive state and cease operating as superconductive devices. On the other hand, if the operating temperature is lower than the critical temperature, such that the difference between the operating temperature and the critical temperature is small, the junction, and the first and second superconductive electrodes will all be in a weak superconductive state. In addition, since no area around the junction will have a strong superconductive state for support, that superconductive state would be destroyed by a small disturbance from the outside. In other words, the superconductive device will have a high probability of malfunction and lack reliability.

As described above, having the critical temperature of the first and second superconductive electrodes higher than that of the operating temperature plays an important role in operation of the device. If the operating temperature is lower than the critical temperature of the junction, the junction is in a superconductive state that is weaker than that of the first and second superconductive electrodes. If the operating temperature is higher than the critical temperature of the junction, it enters a normal conductive state that is near the superconductive state.

In addition to the method described above for creating a normal conductive state near the superconductive state, there are other methods of operation that are discussed below. One method is a method for creating a difference between the pair potential of the first and second superconductive electrodes and the pair potential of the junction. Another, is a method for creating a difference between the carrier density of the first and second superconductive electrodes and the carrier density of the junction.

The basic structure of the 2-terminal superconductive device used in implementing the method of creating a difference in pair potential is the same as illustrated in FIG. 1. Stated in terms of the material employed to manufacture the device, the substrate is made from single crystal $SrTiO_3$ and the junction is a low potential superconductor made from $Y_{0.87}Pr_{0.13}Ba_2Cu_3O_{7-y}$ material. The first and second superconductive electrodes are high potential superconductors made from $YBa_2Cu_3O_{7-y}$ material. Using this superconductive device structure, the film thickness of the low potential superconductor, which is used for the junction, is made from 5 nm to 50 nm thick. The film thickness of the high potential superconductor, which is used for the first and second superconductive electrodes, is made from 50 nm to 150 nm thick.

The method used to produce this superconductive device is generally as follows. Molecular beam epitaxy (MBE) is used to form a thin film of the low potential superconductor $Y_{0.87}Pr_{0.13}Ba_2Cu_3O_{7-y}$ material for junction 2 on the substrate. MBE is then used to form a thin film of the high potential superconductor $YBa_2Cu_3O_{7-y}$ material, for the first and second superconductive electrodes 3 and 4. These two electrodes are formed one after the other. A metallic material is used as a deposition substance, and oxidation of the thin film is then implemented by introducing activated oxygen in an ECR plasma generation apparatus during deposition of the film.

The critical temperatures of the low and high potential superconductors were 72° K. and 90° K., respectively. The critical temperature of the low potential superconductor can be adjusted by changing the Y site and the amount of Pr substitution. If the amount of substitution is decreased, the critical temperature increases. If the amount of substitution is increased, the critical temperature decreases. The lattice constants of these two types of superconductors are almost identical. Which, from the point of view of thin film epitaxial growth technology and manufacturing, is very convenient.

After consecutively forming the low and high potential superconductors on the substrate, etching takes place using photolithography to obtain a 2-terminal superconductive device having the structure shown in FIG. 1. Although not illustrated, a protective film is also formed on the surface area, except for the output electrode, to prevent deterioration.

When the I/V characteristics of the superconductive device obtained using this method were measured, the RSJ characteristics shown in FIG. 3 were observed. The measurement temperature was 70° K., and cooling took place using a Solvay freezer. The size of distance "d" between the first and second superconductive electrodes was altered across a range from 200 nm to 9000 nm, and the appropriate I/V characteristics checked. All measurements showed definite RSJ characteristics.

The structure of a 3-terminal superconductive device used to implement the pair potential method of creating a difference is the same as that shown in FIG. 5. The substrate, low potential and high potential superconductor materials and production method are the same as those used for the 2-terminal superconductive device as previously described for the pair potential method of creating a difference.

The control electrode voltage dependency of the I/V characteristics for this superconductive device are identical to those shown in FIG. 6. It is discernible from these results that the I/V characteristics can be controlled by a voltage applied to the control electrode. The reason this kind of control is possible is that dielectric 5 is polarized by the applied voltage, resulting in a modulation of the carrier for low potential superconductor 2. If an oxide superconductor material is used as the low potential superconductor, because oxide superconductor carriers are fewer than metal superconductors, a large modulation is conveniently possible.

With this superconductive device, because the pair potential on the side of the first and second superconductive electrodes is higher than that of the junction, the superconductive state of the junction becomes stable. Thus, a superconductive device that is highly resistant to changes otherwise caused by disturbances, such as thermal noise, can be obtained. Moreover, the switching time of such a device is high-speed because it is possible to restrain the CR time constant.

Table II shows switching ratios for superconductive devices and a comparison example in which the first and second superconductive electrodes and the junction are formed from the same superconductive materials. The critical temperature of the superconductor in the comparison example is 90° K. It is clear from Table II that by combining the first and second superconductive electrodes and junction using a superconductor with different pair potentials, and by lowering the pair potential of the junction, the switching ratio is increased. In other words, the superconductive device is highly controllable and stable.

TABLE II

|  | Embodiment | Comparison |
| --- | --- | --- |
| Switching Ratio | 18 | 8 |

If this invention is applied to such a 3-terminal device and a plurality of control electrodes are formed or used, multiple-objective applications become possible, just as with dual-type transistors.

A perspective view of a cross section of a 3-terminal superconductive device resulting from the method of creating a difference in the carrier density, is shown in FIG. 9. Here, the superconductive device is formed on a substrate 1, from a junction 2, first superconductive electrode 3, second superconductive electrode 4, a dielectric 5, and a control electrode 6.

Major points concerning the processing and materials used to fabricate this superconductive device are discussed next. First, a thin film of $YBa_2Cu_3O_{7-y}$ type oxide superconductive material from 50 nm to 100 nm thick is formed on top of substrate 1, which is itself made from a single crystal of $SrTiO_3$. The critical temperature of this $YBa_2Cu_3O_{7-y}$ film is 90° K. If the material is such that it does not react much with the superconductive thin film, and has a good lattice constant compatibility, the substrate is not limited to the $SrTiO_3$ material.

After formation of the superconductive thin film, photolithography techniques are used to pattern the material and form first and second superconductive electrodes 3 and 4, at the same time. Next, a 5 nm to 10 nm $La_{2-x}Sr_xCuO_4$ thin layer of superconductor material is used and patterned to obtain junction 2. Therefore, the adjustment of carrier density is promoted by adjusting the value of x in the junction material formulation. Table III shows carrier density for samples in which the value of x was appropriately adjusted. The carrier density was calculated from results measured for the Hall effect of the resulting film.

Although measured values agreed with estimated values based on the amount of Sr substitution in a semi-quantitative manner, they did not reach agreement quantitatively. This is believed to be a result of the fact that the oxygen concentration is removed from the stoichiometric composition in correspondence with the amount of Sr substitution. Dielectric 5 and the control electrode are subsequently formed and patterned.

TABLE III

| Sample No. | Carrier density (1/cm$^3$) |
| --- | --- |
| Embodiment 1 | 8 × 10$^{19}$ |
| Embodiment 2 | 3 × 10$^{20}$ |
| Embodiment 3 | 6 × 10$^{20}$ |
| Embodiment 4 | 9 × 10$^{20}$ |
| Comparison 5 | 5 × 10$^{21}$ |
| Comparison 6 | 8 × 10$^{21}$ |
| Comparison 7 | 9 × 10$^{19}$ |

TABLE IV

| Sample No. | Switching Ratio | Evaluation |
| --- | --- | --- |
| Embodiment 1 | 28 | Good |
| Embodiment 2 | 65 | Excellent |
| Embodiment 3 | 53 | Excellent |
| Embodiment 4 | 30 | Excellent |
| Comparison 5 | 17 | Fair |
| Comparison 6 | 15 | Fail |
| Comparison 7 | 12 | Fail |

Superconductive devices were fabricated using the preceding processes and switching ratios were then examined. Table IV shows the results of this examination along with comparison examples in which the carrier densities are not suitable. The measured temperature is a temperature that is 3° K. lower than the critical temperature of the channel superconductor. Comparison 5 represents a sample for which the critical temperature is the highest.

The evaluations that also appear in Table IV met the following criteria. A switching ratio that has practical value was considered to be 20 or higher, and that value was considered a target value. If the switching ratio was at or more than the target value, it was rated as good. When the switching ratio was 30 or higher, a determination was made that the value was considered quite good and was rated as excellent. When the switching ratio fell below 20, it was basically rated as a failure or undesirable value. However, if the switching ratio was close to 20, it was only rated as fair.

From Tables III and IV, it is seen that in order to obtain good switching characteristics, it is necessary to hold the junction 2 carrier density down to within a specified range from $10^{19}$ to $10^{20}/cm^3$, and even more desirable from a range of $1\times10^{20}$ to $9\times10^{20}/cm^3$. As for the relationship between the carrier density and switching ratio, initially, the switching ratio increases as the carrier density decreases. However, when the carrier density approaches the $10^{19}/cm^3$ level, conversely, the switching ratio tends to decrease. This result is believed to be due to the creation of an unstable junction 2 superconductive state when the carrier density is too small. This, in spite of making the modulation of the carrier density easier by holding down carrier density.

During switching ratio evaluation the result is a failure when carrier density falls below or is lower than a $2\times10^{19}/cm^3$ level. That is, if carrier density is at $2\times10^{19}/cm^3$ when in the $10^{19}/cm^3$ range, acceptable switching characteristics are obtained. Therefore, for a drop in the switching ratio, the switching characteristics for which the superconductive carrier is in control are those when the proximity effect is in control, and in which dimensional freedom (first and second superconductive electrodes 3 and 4 separation) is lost. In addition, because the adjustment of the carrier density for the superconductive device takes place by changing the composition ratio of junction 2, it is possible for this to be accomplished very easily, without addition of another production step.

Another example of a 3-terminal superconductive device resulting from creating a difference in the carrier density is described next. The difference between this superconductive device and the previous embodiment is that a $NdBa_2Cu_3O_{7-y}$ type of superconductor material is used for the first and second superconductive electrodes. In addition, for adjusting the junction carrier density, Nd, which is a trivalent element, is substituted with Tr, which is quadrivalent, allowing the use of a $Nd_{1-w}Pr_wBa_2Cu_3O_{7-y}$ type of superconductor material. Table V shows carrier density for samples that were fabricated using such materials.

TABLE V

| Sample No. | Carrier density $(1/cm^3)$ |
| --- | --- |
| Embodiment 1 | $7 \times 10^{19}$ |
| Embodiment 2 | $3 \times 10^{20}$ |
| Embodiment 3 | $6 \times 10^{20}$ |
| Embodiment 4 | $9 \times 10^{20}$ |
| Comparison 5 | $4 \times 10^{21}$ |
| Comparison 6 | $9 \times 10^{21}$ |

The reason that Pr was selected as a material constituent is that it is the same type of rare earth element as Nd. Also, because Pr has similar properties and an ion radius that is close to that of Nd, which restrains as much as possible changes in its lattice constant and allows adjustment of the carrier density. Depending on the combination and types of superconductive component elements or materials, a number of substitute elements can be selected. However, as is well known, it is necessary to consider that the critical temperature of the superconductor is greatly influenced by the resulting lattice constant. In addition, the adjustment of carrier density for a $NdBa_2Cu_3O_{7-y}$ type superconductor material is also possible by controlling the amount or concentration of oxygen. However, this is not a suitable solution for precision carrier density control.

The switching ratio for the obtained superconductive device was examined and the results are shown in Table VI along with comparison examples that are not suitable values for the carrier density. Comparison number 5, for example, is for a sample in which the critical temperature of the junction was the highest. The first and second superconductive electrodes and junction are made of the same composition. The criteria used for evaluation for the samples presented in Table VI are the same as those associated with Table IV. As shown in Table VI, this superconductive device exhibits obvious improvement in the switching ratio as compared to the comparison example. Based on these results, the carrier density range in which good switching characteristics are obtained is from $10^{19}$ to $10^{20}/cm^3$. A more desirable range is from $3\times10^{20}$ to $6\times10^{20}/cm^3$.

TABLE VI

| Sample No. | Switching Ratio | Evaluation |
| --- | --- | --- |
| Embodiment 1 | 20 | Good |
| Embodiment 2 | 43 | Excellent |
| Embodiment 3 | 30 | Excellent |
| Embodiment 4 | 21 | Good |
| Comparison 5 | 15 | Fail |
| Comparison 6 | 13 | Fail |

When superconductors (here, first and second superconductive electrodes) having a higher carrier density and a high pair potential are formed on both ends of the junction, as is the situation for this superconductive device, the critical temperature of the junction shows a tendency to be markedly higher when the critical temperature of the junction is measured as a single unit. This is believed to be due to the pair potential of the junction being pulled up by the surrounding superconductors. If such a characteristic is utilized, it is possible to use the junction at a higher temperature than otherwise possible when the superconductive device uses the junction as a single unit. Depending on the situation, even if a temperature higher than the critical temperature of the junction is used, it is possible to maintain the junction in a superconductive state. In addition, the stability and repeatability of the characteristics are higher than when using the junction as a single unit.

In the preceding description, the carrier density was described by using two exemplary methods that each substitute elements having different composition ratios. However, in addition to those substitute elements discussed above elements such as Ce, Tb, Bi, Sb, Pb, Ti, Ag, K, Rb, and Cs may also be used. Moreover, in addition to the methods described, it is also possible to use a method in which substitution is used for the Cu site of the Cu-O bond in which either a hole or an electron is introduced directly by another element. Exemplary elements for substitution in the conductive layer Cu site, are Ti, Zr, Hf, V, Nb, Ta, Cr, Mo, W, Mn, Fe, Co, Ni, and Zn, which each have a difference in bonding energy with the oxygen 2p orbit. In addition, such substitutions and methods may be used in combination.

In the above description of a superconductive device using a difference in the carrier density, only a 3-terminal superconductive device was discussed. However, it goes without saying that the methods of creating a difference in carrier density can also be applied to a 2-terminal superconductive device.

A superconductive device that uses superconductive material with a different crystallography for the first and second superconductive electrodes and the junction is described next. Its basic structure is the same as the structure of the 3-terminal superconductive device shown in FIG. 5. Three types of superconductor combinations that differ in terms of crystallography are discussed below, and from which samples were which previously fabricated.

A superconductive device having a first crystallography combination, uses a junction made from a $YBa_2Cu_4O_8$ type superconductor material that is formed on top of a single crystal $SrTiO_3$ substrate. The first and second superconductive electrodes are made from a $YBa_2Cu_3O_{7-y}$, $0 \leq y < 0.2$) superconductor material that differs in terms of crystallography from that of the junction. A dielectric is formed on top of the junction and a control electrode 5. Functions such as switching and amplification for this superconductive device occur by changing the carrier density inside of the junction through the dielectric and control electrode, and by controlling the value of the critical current.

As for a method of fabrication, MBE is generally used to form the film of $YBa_2Cu_4O_8$ that makes up the junction, and the film of $YBa_2Cu_3O_{7-y}$, $0 \leq y < 0.2$) that makes up the first and second superconductive electrodes. This can be accomplished in the same processing chamber and consecutively. A metallic substance is used for the deposition material. The oxidation of the thin film takes place by introducing activated oxygen from an ECR plasma generating apparatus during the film formation. The first and second superconductive electrodes are formed next by etching the $YBa_2Cu_3O_{7-y}$, $0 \leq y < 0.2$) thin film using photolithography techniques and then patterning it. Finally, the dielectric and control electrode are each placed between the first and second superconductive electrodes to obtain the desired superconductive device.

The critical temperatures of the first and second superconductive electrodes used here were 90° K., and the critical temperature of the junction is 70° K.

A superconductive device employing a second crystallographic combination, uses the same structure as that of the first combination and uses a $Bi_2Sr_2Cu_2O_{10}$ type superconductor material to fabricate the first and second superconductive electrodes. A $Bi_2Sr_2Cu_2O_8$ (sometimes Pb is substituted for some of the Bi) type of superconductor material is used to fabricate the junction and differs from the first and second superconductive electrodes in terms of crystallography.

A superconductive device using a third combination having the same structure as the superconductive device of the first combination and using a $YBa_2Cu_3O_{7-y}$, $0 \leq y < 0.2$) type superconductor material to fabricate the first and second superconductive electrodes is described next. A $Bi_2Sr_2Ca_2Cu_2O_{10}$ (sometimes Pb is substituted for some of the Bi) type superconductor material is used to fabricate the junction. In the first and second combinations, the superconductive thin films used for the first and second superconductive electrodes and junctions were, or could be, formed inside of the same processing chamber. However, for this third combination, these films are formed separately using two distinct MBE apparatus. However, the two MBE apparatus are intimately connected and configured so that the films are formed in succession without exposure to the atmosphere.

Ten superconductive devices each were fabricated using the first through third combinations discussed above, for a total of 30, and the associated I/V characteristics at specified control voltages were then measured. The measurements took place in a helium gas atmosphere at a junction critical temperature of 2° K. First variations and critical current values for each of the ten samples were measured, repeating the measurements five times, and the repeatability or reproducibility (fluctuation) was examined. Among these measurements, the fluctuation rate was determined by dividing an average value for the amount of fluctuation, when measured at its greatest, by an average of the critical current. Examples taken from the prior art for changing the first variation, fluctuation rate, and Y-type oxygen contents or concentration, and adjusting the critical temperature are shown in Table VII.

As can be understood from viewing Table VII, the crystal structure for the superconductive devices in the first through third combinations are different, and there is a marked improvement in stability and reliability due to combining superconductors that have a stable superconductive state. This is due to a reduction in fluctuation factors, and the restraint of electro-migration. These values require additional improvements to reduce them further. Moreover, although it is possible to reduce them further, even if the technology advances in the future, the number of destabilizing factors are larger in the prior art technology than found for the superconductive devices in these (first to third) combinations. Thus, it is unlikely that the values of both will be reversed.

TABLE VII

|  | First Variation % | Fluctuation Rate (repeatability) % |
| --- | --- | --- |
| First combination | 21 | 22 |
| Second combination | 18 | 16 |
| Third combination | 16 | 17 |
| Prior Art | 71 | 54 |

In the preceding description of the superconductive device using superconductors with differing crystallography for the first and second superconductive electrodes and junction, only a 3-terminal superconductive device structure was discussed. However, it goes without saying that the method can also be applied to a 2-terminal superconductive device as well.

As indicated above, it is easy to fabricate the superconductive devices of this invention and advantageously provide a high yield, highly reliable superconductive device. In particular, excellent switching characteristics are provided when implemented as a 3-terminal superconductive device. Therefore, the invention is suitable to providing switching devices for high speed and low power consumption logic circuits.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

We claim:

1. A method of operating a superconductive device having a first superconductive electrode comprising a first material and having a first critical temperature, a second superconductive electrode comprising a second material and having a second critical temperature, and a junction for coupling the first superconductive electrode to the second superconductive electrode, the junction having a control electrode and having a third critical temperature lower than the first and second critical temperatures of the first and second superconductive electrodes, respectively, the junction comprising a third material having a composition which is different than the first and second material of the first and second superconductive electrodes, respectively; said method comprising the steps of:

operating the superconductive device at a temperature that is no more than the third critical temperature of the junction; and applying a control voltage to the control electrode and controlling the current flowing through the first and second superconductive electrodes.

2. A method of operating a superconductive device having a first superconductive electrode comprising a first material and having a first pair potential magnitude, a second superconductive electrode comprising a second material and having a second pair potential magnitude, and a junction for coupling the first superconductive electrode to the second superconductive electrode, the junction having a control electrode and having a third pair potential magnitude lower than the first and second pair potential magnitude of the first and second superconductive electrodes, respectively, the junction comprising a third material having a composition which is different than the first and second material of the first and second superconductive electrodes, respectively, the junction having a third critical temperature , said method comprising the steps of:

operating the superconductive device at a temperature that is no more than the third critical temperature of the junction; and applying a control voltage to the control electrode and controlling the current flowing through the first and second superconductive electrodes.

3. A method of operating a superconductive device comprising the steps of:

a. providing a first superconductive electrode comprising a first material and having a first critical temperature;

b. providing a second superconductive electrode comprising a second material and having a second critical temperature;

c. providing a junction for coupling the first superconductive electrode to the second superconductive electrode, the junction having a control electrode and having a third critical temperature lower than the first and second critical temperatures of the first and second superconductive electrodes, respectively, the junction comprising a third material having a composition which is different than the first and second material of the first and second superconductive electrodes, respectively;

d. operating the superconductive device at a temperature that is no more than the third critical temperature of the junction; and e. supplying a control voltage to the control electrode and controlling the current flowing through the first and second superconductive electrodes.

4. The method of claim 3, further comprising the step of using said junction as a conductive channel.

5. The method of claim 4, wherein a carrier density of said junction is smaller than a carrier density of said first and second superconductive electrodes.

6. The method of claim 4, wherein said junction, and first and second superconductive electrodes each comprise an oxide superconductive material.

7. The method of claim 3, wherein in step (d), the device operating temperature is set within minus five degrees Kelvin of the critical temperature of said junction.

8. The method of claim 3, wherein a carrier density of said junction is smaller than a carrier density of said first and second superconductive electrodes.

9. The method of claim 3, said first and second superconductive electrodes each comprise an oxide superconductive material.

10. The method of claim 9, wherein a crystal structure of said junction differs from that of said first and second superconductive electrodes.

11. The method of claim 3, wherein a carrier density of said junction is in the range from about $10^{19}$ to $10^{20}/cm^3$.

12. The method of claim 8, further comprising the step of adjusting the carrier density of said junction using a superconductive composition with a variable composition ratio that is varied to introduce at least one of electrons and holes.

13. The method of claim 11, further comprising the step of adjusting the carrier density of said junction using an element having a composition different than said junction that introduces at least one of electrons and holes and is adjusted through elemental substitution in the material composition.

14. The method of claim 3, wherein said junction comprises $YBa_2Cu_3O_{7-x}$ (where $0.2 \leq x \leq 0.5$) material.

15. The method of claim 3, wherein said first and second electrodes comprise $YBa_2Cu_3O_{7-y}$ (where $0 \leq y < 0.2$) material.

16. The method of claim 3, wherein said first and second electrodes are formed on a substrate comprising $SrTiO_3$ material.

17. The method of claim 7, further comprising the step of setting the operating temperature within minus three degrees Kelvin of said critical temperature of said junction.

18. A method of operating a superconductive device comprising the steps of:

a. providing a first superconductive electrode comprising a first material and having a first pair potential magnitude;

b. providing a second superconductive electrode comprising a second material and having a second pair potential magnitude;

c. providing a junction for coupling the first superconductive electrode to the second superconductive electrode, the junction having a control electrode and having a third pair potential magnitude lower than the first and second pair potential magnitude of the first and second superconductive electrodes, respectively, the junction comprising a third material having a composition which is different than the first and second material of the first and second superconductive electrodes, respectively, the junction having a third critical temperature; and d. operating the superconductive device at a temperature that is no more than the third critical temperature of the junction; and e. supplying a control voltage to the control electrode and controlling the current flowing through the first and second superconductive electrodes.

19. The method of claim 18, further comprising the step of using said junction as a conductive channel.

20. The method of claim 19, wherein a carrier density of said junction is smaller than a carrier density of said first and second superconductive electrodes.

21. The method of claim 19, wherein said junction, and first and second superconductive electrodes each comprise an oxide superconductive material.

22. The method of claim 18, wherein in said step setting a device operating temperature, the device operating temperature is set within minus five degrees Kelvin of the critical temperature of said junction.

23. The method of claim 18, wherein a carrier density of said junction is smaller than a carrier density of said first and second superconductive electrodes.

24. The method of claim 18, wherein said junction, and first and second superconductive electrodes each comprise an oxide superconductive material.

25. The method of claim 24, wherein a crystal structure of said junction differs from that of said first and second superconductive electrodes.

26. The method of claim 18, wherein a carrier density of said junction is in the range from about $10^{19}$ to $10^{20}/cm^3$.

27. The method of claim 23, further comprising the step of adjusting the carrier density of said junction using a superconductive composition with a variable composition ratio that is varied to introduce at least one of electrons and holes.

28. The method of claim 26, further comprising the step of adjusting the carrier density of said junction using an element having a composition different than said junction that introduces at least one of electrons and holes and is adjusted through elemental substitution in the material composition.

29. The method of claim 18, wherein said junction comprises $YBa_2Cu_3O_{7-x}$ (where $0.2 \leq x \leq 0.5$) material.

30. The method of claim 18, wherein said first and second electrodes comprise $YBa_2Cu_3O_{7-y}$ (where $0 \leq y < 0.2$) material.

31. The method of claim 18, wherein said first and second electrodes are formed on a substrate comprising $SrTiO_3$ material.

32. The method of claim 22, further comprising the step of setting the operating temperature within minus three degrees Kelvin of said third critical temperature of said junction.

* * * * *

UNITED STATES PATENT AND TRADEMARK OFFICE
CERTIFICATE OF CORRECTION

PATENT NO.    : 5,804,835
DATED         : September 08, 1998
INVENTOR(S)   : Taketomi Kamikawa, et al.

It is certified that an error appears in the above identified patent and that said Letters Patent is hereby corrected as shown below:

Title page, item [56], References Cited, please insert --Other Publications Superconductor Science & Technology, Volume 4, Number 9, September 1991, "New FET using the superconducting phase transition of a high temperature oxide superconductor", by J.F. Jiang, et al., pages 468-470.--

Signed and Sealed this

Fourth Day of May, 1999

*Attest:*

Q. TODD DICKINSON

*Attesting Officer*    Acting Commissioner of Patents and Trademarks